United States Patent
Tomatsu et al.

(10) Patent No.: US 10,883,027 B2
(45) Date of Patent: Jan. 5, 2021

(54) FILM-FORMING COMPOSITION, METHOD FOR PRODUCING SURFACE-TREATED METAL MEMBER, AND METHOD FOR PRODUCING METAL-RESIN COMPOSITE

(71) Applicant: MEC COMPANY LTD., Hyogo (JP)

(72) Inventors: Itsuro Tomatsu, Hyogo (JP); Kosuke Kumazaki, Hyogo (JP); Yasutaka Amitani, Hyogo (JP); Yuko Shibanuma, Hyogo (JP); Ikuyo Katayama, Hyogo (JP)

(73) Assignee: MEC COMPANY LTD., Hyogo (JP)

( * ) Notice: Subject to any disclaimer, the term of this patent is extended or adjusted under 35 U.S.C. 154(b) by 0 days.

(21) Appl. No.: 16/611,250

(22) PCT Filed: Mar. 2, 2018

(86) PCT No.: PCT/JP2018/008188
§ 371 (c)(1),
(2) Date: Nov. 6, 2019

(87) PCT Pub. No.: WO2018/207443
PCT Pub. Date: Nov. 15, 2018

(65) Prior Publication Data
US 2020/0157394 A1    May 21, 2020

(30) Foreign Application Priority Data

May 11, 2017    (JP) .................................. 2017-094633

(51) Int. Cl.
*C09J 179/02*    (2006.01)
*B32B 15/08*    (2006.01)
(Continued)

(52) U.S. Cl.
CPC ............. *C09J 179/02* (2013.01); *B32B 15/08* (2013.01); *B32B 15/20* (2013.01); *B32B 37/12* (2013.01);
(Continued)

(58) Field of Classification Search
CPC ....................................................... C09J 179/02
See application file for complete search history.

(56) References Cited

U.S. PATENT DOCUMENTS

2010/0288731 A1    11/2010    Wunderlich et al.
2014/0261897 A1    9/2014    Wei et al.
(Continued)

FOREIGN PATENT DOCUMENTS

CN    103118806    5/2013
JP    7-258870    10/1995
(Continued)

OTHER PUBLICATIONS

Extended European Search Report dated May 8, 2020 in corresponding European Patent Application No. 18798853.0.
(Continued)

*Primary Examiner* — Daniel H Lee
(74) *Attorney, Agent, or Firm* — Wenderoth, Lind & Ponack, L.L.P.

(57) ABSTRACT

The coating film-forming composition includes an aromatic compound having an amino group and an aromatic ring in one molecule, and thio compound (sulfur oxoacids having a pKa of −1.9 or less and salts thereof are excluded). pH of the coating film-forming composition is 4 to 10. The thio compound is preferably one that ionized to form anions in a solution, and thiosulfate and thiocyanate are especially preferable. By bringing the coating film-forming composition into contact with the surface of a metal member, a coating (Continued)

film is formed on the surface of the metal member, so that a surface-treated metal member can be obtained.

11 Claims, 1 Drawing Sheet

(51) Int. Cl.
    *B32B 15/20* (2006.01)
    *B32B 37/12* (2006.01)
    *C09J 5/02* (2006.01)
    *C09J 11/04* (2006.01)
    *C23C 22/06* (2006.01)
    *C23C 22/63* (2006.01)
    *C23C 22/68* (2006.01)
    *H05K 3/38* (2006.01)

(52) U.S. Cl.
    CPC .............. *C09J 5/02* (2013.01); *C09J 11/04* (2013.01); *C23C 22/06* (2013.01); *C23C 22/63* (2013.01); *C23C 22/68* (2013.01); *H05K 3/386* (2013.01); *C09J 2400/166* (2013.01); *C09J 2479/02* (2013.01)

(56) References Cited

U.S. PATENT DOCUMENTS

| | | |
|---|---|---|
| 2015/0152124 A1 | 6/2015 | Mori et al. |
| 2016/0368935 A1 | 12/2016 | Miura et al. |

FOREIGN PATENT DOCUMENTS

| | | | |
|---|---|---|---|
| JP | 2000-73181 | | 3/2000 |
| JP | 2000073181 A | * | 3/2000 |
| JP | 2000-286546 | | 10/2000 |
| JP | 2005-60754 | | 3/2005 |
| JP | 2012-077038 | | 4/2012 |
| JP | 2015-143395 | | 8/2015 |
| JP | 2015-214743 | | 12/2015 |
| JP | 2015214743 A | * | 12/2015 |
| JP | 2016-056449 | | 4/2016 |
| JP | 2016056449 A | * | 4/2016 |
| JP | 2018-016865 | | 2/2018 |
| JP | 6440440 | | 12/2018 |
| WO | 2007/093284 | | 8/2007 |
| WO | 2009/066658 | | 5/2009 |
| WO | 2009/110364 | | 9/2009 |
| WO | 2013/186941 | | 12/2013 |

OTHER PUBLICATIONS

Office Action dated May 20, 2020 in corresponding Chinese Patent Application No. 201880026350.1.
International Search Report (ISR) dated May 29, 2018 in International (PCT) Application No. PCT/JP2018/008188.

* cited by examiner

FILM-FORMING COMPOSITION, METHOD FOR PRODUCING SURFACE-TREATED METAL MEMBER, AND METHOD FOR PRODUCING METAL-RESIN COMPOSITE

TECHNICAL FIELD

The present invention relates to a coating film-forming composition for forming a coating film on a surface of a metal member for improving adhesion to a resin. Further, the present invention relates to a method for producing a surface-treated metal member using the coating film-forming composition, and also to a method for producing a metal-resin composite.

BACKGROUND ART

In the printed wiring board production process, a resin material such as an etching resist, a plating resist, a solder resist, or a prepreg is joined to the surface of a metal layer or a metal wiring. In the printed wiring board production process and also in the produced products, high adhesion is required between the metal and the resin. Examples of the known method for improving adhesion between a metal and a resin are the followings: forming fine irregularities on a metal surface using a roughening agent (microetching agent); forming a coating film for improving adhesion to a resin (adhesive layer) on the surface of a metal; forming an adhesive layer on a roughened surface.

For example, Patent Document 1 discloses that a surface of a leadframe made of a copper alloy is roughened with an acidic aqueous solution including sulfuric acid, hydrogen peroxide as an oxidizing agent, a nitrogen-containing heterocyclic compound and sulfinic acid, and specific amounts of fluoride ion and chloride ion, thereby improving adhesion to a resin. Patent Document 2 discloses that when a copper coating film is immersed in a sulfur-containing compound solution, a coating film that acts as an adhesion improver is formed. Patent Document 3 discloses that when copper surface is treated with an aqueous solution containing a specific tetrazole compound, a halogen compound and a metal salt, the adhesion to a resin can be improved.

Patent Document 4 discloses that an adhesion between the copper wiring and an epoxy resin can be improved when the surface of a copper wiring is subjected to a roughening treatment with an acidic aqueous solution containing copper ion, and then treated with an aqueous solution containing an organic acid, a benzotriazole-based antirust agent, and a silane coupling agent. Patent Document 5 and Patent Document 6 disclose that an adhesion between the metal and a resin can be improved by bringing a solution containing a specific silane compound into contact with the metal surface to form a coating film. Patent Document 7 discloses that an adhesion between the metal and a resin can be improved by applying an antirust agent containing a triazole-based compound, a silane coupling agent, and an organic acid to the copper foil surface.

PRIOR ART DOCUMENTS

Patent Documents

Patent Document 1: WO 2007/093284 A
Patent Document 2: JP 2000-73181 A
Patent Document 3: JP 2005-60754 A
Patent Document 4: JP 2000-286546 A
Patent Document 5: JP 2015-214743 A
Patent Document 6: WO 2013/186941
Patent Document 7: JP 7-258870 A

SUMMARY OF THE INVENTION

Problems to be Solved by the Invention

Depending on the kind of resin, the method for roughening a surface of a metal layer as described in Patent Document 1 may not offer sufficient adhesion. In addition, in order to enhance adhesion to a resin, it is necessary to increase the etching depth (e.g., in the Examples of Patent Document 1, the surface of copper is etched 1 μm or more). Therefore, in the case where the method is applied to a metal wiring of a printed wiring board, remarkable thinning of the wiring is caused, and adoption to wiring microfabrication (fine pitch) is limited.

According to the method of surface treating a metal layer and the method of forming a coating film on a surface of a metal layer as described in Patent Documents 2 to 7, it is not necessary to dispose an additional metal layer (e.g., tin-plated layer) for improving adhesion, so that the process of joining a metal and a resin can be simplified. However, in the conventional compositions, since the film adhesion on a metal surface and surface treatment efficiency are poor, the adhesion between a metal and a resin may be insufficient. In addition, in order to sufficiently improve adhesion to a resin, it is necessary to increase the time period of contact between the composition (solution) and a metal, or form a coating film by drying the solvent under the condition where the solution is attaching to the surface of a metal.

In view of the above background, an object of the present invention is to provide a coating film-forming composition that is capable of forming a coating film having excellent adhesion to a resin on a metal surface in a short period of time.

Means for Solving the Problems

As a result of research, the present inventors have found that a composition containing a specific aromatic compound, a thio compound, and an oxidizing agent has excellent film formability on a metal surface, is capable of significantly improving metal-resin adhesion, and is also excellent in terms of acid resistance.

The coating film-forming composition of the present invention contains an aromatic compound having an amino group and an aromatic ring in one molecule, and a thio compound or a salt thereof. A pH of the coating film-forming composition preferably is preferably within a range of 4 to 10. As the thio compound, one that is ionized to form anions in an aqueous solution (however, sulfur oxoacids and salts thereof having a pKa of −1.9 or less, such as sulfuric acid and alkyl sulfonic acids, are excluded), such as thiosulfate or thiocyanate, is preferable.

By bringing the coating film-forming composition described above into contact with a surface of a metal member, a coating film is formed on the metal member surface. The surface-treated metal member having a coating film formed thereon has excellent adhesion to a resin. The metal member may be a copper or copper alloy material.

Effects of the Invention

An adhesion between a metal member and a resin can be improved by forming a coating film on a surface of the metal member, such as copper or a copper alloy, using the coating film-forming composition of the present invention. When the metal member and a resin are joined together with the coating film therebetween, a metal-resin composite with an excellent adhesion can be obtained.

MODE FOR CARRYING OUT THE INVENTION

[Coating Film-forming Composition]

Figure 1:
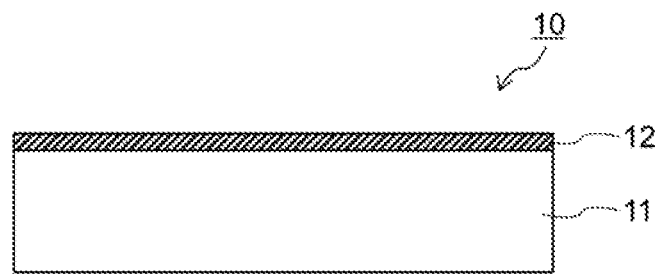
FIG. 1 is a schematic cross-sectional view showing one embodiment of a surface-treated metal member.

The coating film-forming composition of the present invention is used for forming a coating film on a metal surface. The coating film-forming composition contains an aromatic compound having an amino group and an aromatic ring in one molecule, and thio compound. Hereinafter, each component contained in the coating film-forming composition of the present invention will be described.

<Aromatic Compound>

The aromatic compound is a material that serves as a main component of a coating film. The aromatic compound has an amino group and an aromatic ring in one molecule.

The aromatic ring may be composed only of carbon and hydrogen, or may also be a heteroaromatic ring containing a heteroatom such as nitrogen, oxygen, or sulfur. The aromatic ring may be monocyclic or condensed polycyclic. It is preferable that the aromatic compound contains a nitrogen-containing aromatic ring. Examples of nitrogen-containing aromatic rings include monocyclic rings such as pyrrole, pyrazole, imidazole, triazole, tetrazole, oxazole, oxadiazole, isoxazole, thiazole, isothiazole, furazane, pyridine, pyridazine, pyrimidine, pyrazine, triazine, tetrazine, pentazine, azepine, diazepine, and triazepine; condensed bicyclic rings such as indole, isoindole, thienoindole, indazole, purine, quinoline, isoquinoline, and benzotriazole; condensed tricyclic rings such as carbazole, acridine, β-carboline, acridone, perimizine, phenazine, phenanthridine, phenothiazine, phenoxazine, and phenanthroline; condensed tetracyclic rings such as quindoline and quinindoline; and condensed pentacyclic rings such as acrindoline. Among them, nitrogen-containing aromatic rings containing two or more nitrogen atoms, such as pyrazole, imidazole, triazole, tetrazole, pyridazine, pyrimidine, pyrazine, triazine, tetrazine, and pentazine, are preferable, and imidazole, triazole, and triazine are particularly preferable.

The amino group may be primary, secondary, or tertiary, or may also be heterocyclic. The amino group may be directly or indirectly bonded to the aromatic ring. The aromatic compound may have two or more amino groups in one molecule. A nitrogen-containing aromatic ring corresponds to both a heterocyclic amino group and an aromatic ring. Therefore, in the case where the above aromatic ring is a nitrogen-containing aromatic ring, an amino group does not have to be contained separately from the aromatic ring. The aromatic compound preferably has a secondary amino group and/or a primary amino group, and particularly preferably has a primary amino group. As the aromatic compound, one having a secondary amino group and/or primary amino group that does not constitute the aromatic ring is preferable, and one having a primary amino group that does not constitute the aromatic ring is particularly preferable.

Because a coating film having excellent adhesion between a metal and a resin can be formed, it is preferable that the aromatic compound is a compound having a nitrogen-containing aromatic ring and having a primary amino group indirectly bonded to the nitrogen-containing aromatic ring through an alkylene group, an alkylene amino group, or the like.

The aromatic compound is not particularly limited in structure as long as it has an aromatic ring and an amino group, and may also have a functional group other than the amino group, such as a hydroxy group, a carboxy group, an amide group, a cyano group, a nitro group, an azo group, a diazo group, a mercapto group, an epoxy group, a silyl group, a silanol group, or an alkoxysilyl group. In particular, in the case where the aromatic compound has an alkoxysilyl group or a hydroxysilyl group, the aromatic compound has a function as a silane coupling agent, and thus the adhesion between a metal and a resin is likely to improve.

Among the above examples, it is preferable that the aromatic compound has, outside the aromatic ring, at least one functional group selected from the group consisting of a primary amino group, a secondary amino group, an alkoxysilyl group, and a hydroxysilyl group. The aromatic compound preferably contains a nitrogen-containing aromatic ring, and a nitrogen-containing aromatic ring containing two or more nitrogen atoms is particularly preferable. In the case where the aromatic ring of the aromatic compound contains no nitrogen atom, it is preferable that the aromatic compound contains an alkoxysilyl group or a hydroxysilyl group outside the aromatic ring.

When the aromatic compound has a high molecular weight, the solubility in water or an organic solvent may decrease, or the adhesion of the coating film to a metal surface may decrease. Therefore, the molecular weight of the aromatic compound is preferably 1,500 or less, more preferably 1,200 or less, and still more preferably 1,000 or less.

(Specific Examples of Aromatic Compound)

As examples of the aromatic compound, imidazole silane compounds represented by the following general formulae (I) and (II) can be mentioned (e.g., JP 2015-214743 A).

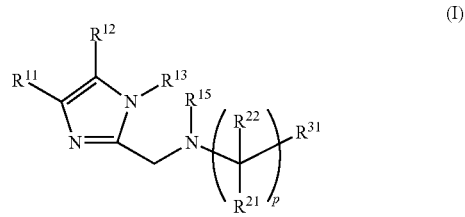

(I)

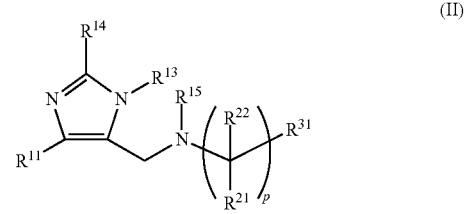

(II)

$R^{11}$ to $R^{15}$ in general formulae (I) and (II) are each independently a hydrogen atom or a $C_{1-20}$ alkyl group, an allyl group, a benzyl group, or an aryl group. $R^{21}$ and $R^{22}$ each independently represent a hydrogen atom, a $C_{1-4}$ alkyl group, a hydroxy group, or a methoxy group, and p is an integer of 0 to 16. $R^{31}$ is a primary amino group ($-NH_2$) or an alkoxysilyl group or hydroxysilyl group represented by —Si(OR$^{41}$)$_k$R$^{42}$$_{(3-k)}$ (k is an integer of 1 to 3, and R$^{41}$ and R$^{42}$ are each independently a hydrogen atom or a C$_{1-6}$ alkyl group).

As represented by the following general formula (III), a silane compound having a triazole ring as a nitrogen-containing aromatic ring may also be suitably used as the aromatic compound (e.g., JP 2016-56449 A).

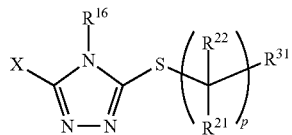
(III)

R$^{21}$, R$^{22}$, R$^{31}$, and p in general formula (III) are as defined for the above general formulae (I) and (II). R$^{16}$ is a hydrogen atom, a C$_{1-20}$ alkyl group, an allyl group, a benzyl group, or an aryl group. X is a hydrogen atom, a methyl group, —NH$_2$, —SH, or —SCH$_3$, and particularly preferably —NH$_2$.

As the aromatic compound, a compound having a triazine ring may also be suitably used. The following general formula (IV) is an example of the aromatic compound having a triazine ring and an amino group, wherein substituents are present on 2-, 4-, and 6-positions of 1,3,5-triazine, and at least one of them has a terminal amino group.

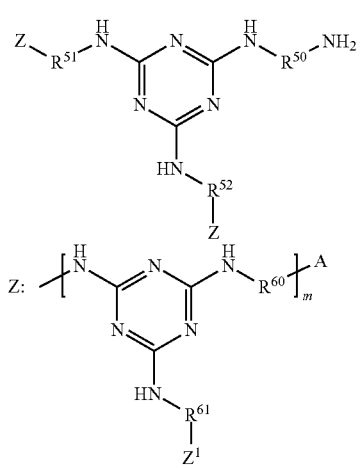
(IV)

In the above general formula (IV), R$^{50}$, R$^{51}$, R$^{52}$, R$^{60}$, and R$^{61}$ are each independently an arbitrary divalent group, such as a substituted or unsubstituted alkylene group optionally having a C$_{1-6}$ branch. The alkylene group may contain ether, carbonyl, carboxy, amide, imide, carbamide, carbamate, or the like at the terminal or between carbons. Z$^1$ is the same group as Z. m and n are each independently an integer of 0 to 6. The terminal group A is a hydrogen atom, a primary amino group (—NH$_2$), or an alkoxysilyl group or hydroxysilyl group represented by —Si(OR$^{41}$)$_k$R$^{42}$$_{(3-k)}$ (k is an integer of 1 to 3, and R$^{41}$ and R$^{42}$ are each independently a hydrogen atom or a C$_{1-6}$ alkyl group).

A compound of general formula (IV) wherein two Zs are each m=0, and the terminal group A is an amino group, is represented by the following formula (V).

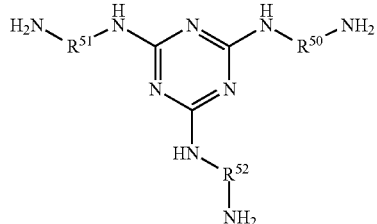
(V)

The compound of the above general formula (V) is obtained, for example, by allowing cyanuric halide to react with three molar equivalents of an alkylene diamine. In the case where one amino group of the alkylene diamine reacts with cyanuric halide, while the other amino group remains unreacted, as in the above formula (V), a derivative having an amino group at the terminal is obtained. When both of the amino groups of the alkylene diamine react with cyanuric halide, an aromatic compound having a plurality of triazine rings (a compound wherein m in Z is 1 or more) is produced.

When the polymerization degree of the triazine derivative represented by the above general formula (IV) increases, the solubility in water or an organic solvent may decrease. Therefore, in the synthesis of a triazine derivative having an amino group at the terminal, it is preferable to use an excess of alkylene diamine relative to cyanuric halide.

A compound of general formula (IV) wherein one of the two Zs is m=0, and the terminal group A is an amino group, while the other Z is m=0, and the terminal group A is a trialkoxysilyl group, is represented by the following formula (VI).

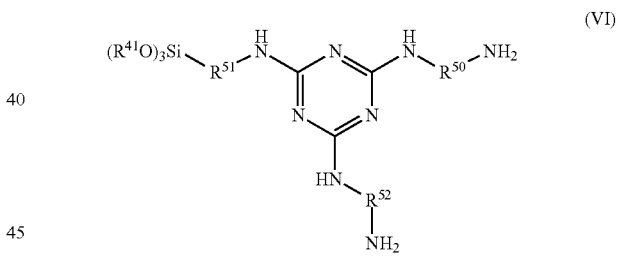
(VI)

The compound represented by the above general formula (VI) is a silane coupling agent having a triazine ring and an amino group, and can be obtained by the method described in WO 2013/186941, for example.

As an aromatic compound having a triazine ring, in addition to those mentioned above, as represented by the following general formulae (VII) and (VIII), a compound wherein an alkylenethio group is bonded to a triazine ring can be mentioned (e.g., JP 2016-37457 A), for example.

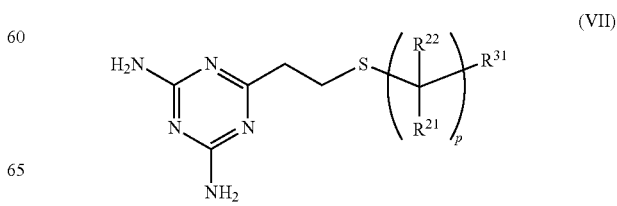
(VII)

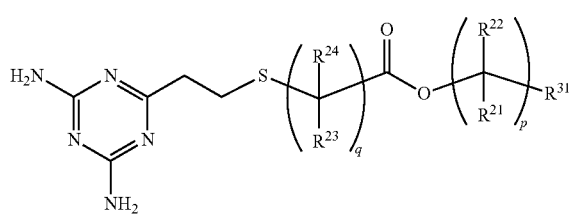
(VIII)

In the above general formulae (VII) and (VIII), $R^{21}$ to $R^{24}$ each independently represent a hydrogen atom, a $C_{1-4}$ alkyl group, a hydroxy group, or a methoxy group. $R^{31}$ is a primary amino group (—$NH_2$) or an alkoxysilyl group or hydroxysilyl group represented by —$Si(OR^{41})_k R^{42}_{(3-k)}$ (k is an integer of 1 to 3, and $R^{41}$ and $R^{42}$ are each independently a hydrogen atom or a $C_{1-6}$ alkyl group). p is an integer of 0 to 16, and q is 1 or 2.

Although a silane compound having an imidazole ring, a silane compound having a triazole ring, and a compound having a triazine ring have been mentioned as examples of the aromatic compound, the aromatic compound in the coating film-forming composition is not limited to the example compounds mentioned above, as long as it has an amino group and an aromatic ring in one molecule.

(Content of Aromatic Compound)

The content of the aromatic compound in the coating film-forming composition is not particularly limited. In terms of improving film formability on a metal surface, the content of the aromatic compound is preferably 0.01 to 10 wt %, more preferably 0.03 to 7 wt %, and still more preferably 0.05 to 5 wt %.

<Thio Compound>

A thio compound is a component that promotes coating film formation on a metal surface. In a conventional coating film-forming agent, generally, drying is performed to form a film with a solution containing a silane coupling agent or the like attaching to a metal surface. In contrast, because the coating film-forming composition of the present invention contains a thio compound, formation of a coating film on a metal surface is promoted at the time when the solution contacts a metal surface.

As the thio compound, a sulfur-containing compound or a salt thereof is used, but sulfur oxoacids and salts thereof having a pKa of −1.9 or less, such as sulfuric acid or an alkyl sulfonic acid are excluded therefrom. With respect to the thio compound and salts thereof, it is necessary that the acid dissociation constant of the first stage $pKa_1$ is more than −1.9.

Examples of thio compounds include salts of sulfur oxoacids (limited to those having a pKa of more than −1.9) such as thiosulfate and sulfite; thioacids such as thiocyanic acid, dithiocarbamic acid, dithiocarboxylic acids, and hydrogen sulfide, as well as salts thereof; and sulfur-containing carboxylic acids such as thioglycolic acid, thiolactic acid, thiomalic acid, thiotartaric acid, 3-mercaptopropionic acid, and dithioglycolic acid, as well as salts thereof. Examples of other thio compounds include esters of oxoacids, thioacids, and sulfur-containing carboxylic acids; mercapto compounds such as 2-mercaptoethanol, 4-aminothiophenol, 2,2'-dimercaptodiethylsulfide, dithiothreitol, and dithioerytriol; thiocyanate compounds such as benzyl thiocyanate, phenyl isothiocyanate, and benzyl isothiocyanate; sulfonamide compounds such as 1-pentanesulfonamide, sulfinamide compounds such as t-butyl sulfinamide; thiadiazole compounds such as 2,4-thiazolidinedione, 2-thio-4-thiazolidone, and 2-imine-4-thiazolidinone, thioureas such as thiourea, N-methyl urea, N,N'-dimethyl urea, N-phenyl urea, guanyl thiourea, dicyclohexyl thiourea, and diphenyl thiourea; cysteine, homocysteine, and cysteamine, as well as salts and esters thereof and thioglycerol, thioproline, and 3,3'-dithiodipropanol. Examples of the above salts include sodium salts, potassium salts, and ammonium salts. As described layer, in terms of preventing the deposition of a metal due to displacement plating, it is preferable that the coating film-forming composition is substantially free of a salt of a noble metal.

Among the above thio compounds, in the case of using a compound that is ionized to form anions in the coating film-forming composition (aqueous solution), the film formability on a metal surface tends to improve. In particular, salts of acids having a pKa of −1.8 to 5, such as thiosulfuric acid ($pKa_1$=0.6, $pKa_2$=1.6) and thiocyanic acid (pKa=−1.3), are preferable, and salts of acids having a pKa of −1.5 to 2 are particularly preferable.

In terms of reducing the time required for coating film formation, the content of the thio compound in the coating film-forming composition is preferably 0.001 wt % or more, more preferably 0.01 wt % or more, and still more preferably 0.03 wt % or more. Although the upper limit of the content of the thio compound is not particularly set, in terms of achieving both the improvement in film formability and the durability and adhesion to a resin of the coating film, the content of the thio compound is preferably 5 wt % or less, more preferably 3 wt % or less, and still more preferably 1 wt % or less. From the same point of view, the content of the thio compound in the coating film-forming composition is preferably 0.005 to 20 times, more preferably 0.01 to 15 times, still more preferably 0.1 to 10 times, and particularly preferably 0.2 to 5 times the content of the aromatic compound on a weight basis. In the case where two or more kinds of thio compounds are used, it is preferable that the total of the thio compound contents is within the above range.

<Solvent>

The coating film-forming composition of the present invention is prepared by dissolving the aromatic compound and the thio compound in a solvent. The solvent is not particularly limited as long as the above components can be dissolved, and water, alcohols such as ethanol and isopropyl alcohol, esters, ethers, ketones, aromatic hydrocarbons, and the like may be used. As water, water from which ionic matters and impurities have been removed is preferable. For example, ion exchange water, pure water, ultrapure water, and the like are preferably used.

<Other Components>

The coating film-forming composition of the present invention may also contain components other than those mentioned above. Examples of other components include chelating agents, silane coupling agents, pH adjusting agents, surfactants, and stabilizing agents.

When the coating film-forming composition contains a chelating agent to a metal, a chelate is formed with a small amount of metal ion eluted into the solution. Accordingly, the precipitation of insoluble matter in the solution that accompanies binding between the metal ion and the aromatic compound can be suppressed.

In the case where the above aromatic compound does not have an alkoxysilyl group (i.e., in the case where the aromatic compound is not a silane coupling agent), the adhesion between a metal surface and a resin tends to improve when a silane coupling agent is contained as an additive in the coating film-forming composition. Also in the case where the above aromatic compound is a silane coupling agent, another silane coupling agent may be contained as an additive in the coating film-forming composition.

The pH of the coating film-forming composition of the present invention is preferably 4 to 10. When the pH is 4 or more, the etching of the metal surface is suppressed, and the film formability can be improved. At the same time, because the amount of metal dissolution is reduced, the stability of the solution improves. In addition, when the pH is 10 or less, the solubility of the aromatic compound is excellent, and the stability of the solution improves. The pH of the coating film-forming composition is more preferably 5 to 9. As pH adjusting agents, various acids and alkalis may be used without particular limitation.

In the case where the above aromatic compound is a silane coupling agent having an alkoxysilyl group, the silane coupling agent may be partially or completely condensed in the coating film-forming composition of neutral pH range. However, when the condensation excessively proceeds, the silane coupling agent may be precipitated, resulting in a decrease in film formability. Therefore, even in the case where the silane coupling agent is condensed, the weight average molecular weight is preferably 1,500 or less, more preferably 1,200 or less, and still more preferably 1,000 or less, and it is preferable that the condensation degree is suppressed so that the weight average molecular weight will be within this range.

In order to prevent etching due to the oxidation of a metal, it is preferable that the coating film-forming composition is substantially free of an oxidizing agent that oxidizes the metal on which a coating film is to be formed. Examples of metal oxidizing agents include hypochlorous acid, chlorous acid, chloric acid, perchloric acid, permanganic acid, persulfuric acid, percarbonic acid, hydrogen peroxide, organic peroxides, and salts thereof. The content of the oxidizing agent in the coating film-forming composition is preferably 0.5 wt % or less, more preferably 0.1 wt % or less, and still more preferably 0.05 wt % or less. When the coating film-forming composition is substantially free of a metal oxidizing agent, the elution of the metal is reduced, and the stability of the solution can be improved.

In the case where the metal on which a coating film is to be formed is copper, cupric ions and ferric ions also have the action of dissolving copper due to oxidation. In addition, when copper that has been eluted into the solution (cuprous ions) is oxidized into cupric ions, the etching of copper due to oxidation may be promoted. Therefore, the content of cupric ions and ferric ions in the coating film-forming composition is preferably 1 wt % or less, more preferably 0.5 wt % or less, and still more preferably 0.1 wt % or less.

When a metal that is more noble than the metal on which a coating film is to be formed (a metal having a lower ionization tendency) is contained in the coating film-forming composition, it may happen that the noble metal is deposited due to the displacement plating action, whereby the properties of the metal layer, the adhesion of the coating film, and the like are affected. Therefore, it is preferable that the coating film-forming composition is substantially free of a metal that is more noble than the metal on which a coating film is to be formed. For example, in the case where the metal on which a coating film is to be formed is copper, the concentration of mercury, silver, palladium, iridium, platinum, gold, and metal salts thereof in the coating film-forming composition is preferably 1,000 ppm or less, more preferably 500 ppm or less, still more preferably 100 ppm or less, particularly preferably 50 ppm or less, and most preferably 10 ppm or less.

[Formation of Coating Film on Metal Member Surface]

The above coating film-forming composition is brought into contact with a surface of a metal member, and the solvent is removed by drying as necessary. As a result, as shown in FIG. 1, a coating film 12 is formed on a surface of the metal member 11. The coating film 12 is a film for improving adhesion to a resin. When the coating film is disposed on a surface of a metal member, the adhesion between the metal member and a resin improves.

Examples of metal members include the surface of a copper foil (electrolytic copper foil, rolled copper foil) used for electronic components such as semiconductor wafers, electronic substrates, and leadframes, decorative items, building materials, and the like, the surface of a copper-plated film (electroless copper-plated film, electrolytic copper-plated film), and also wire-shaped, rod-shaped, tube-shaped, and plate-shaped copper materials for various applications. In particular, the coating film-forming composition of the present invention has excellent film formability on a copper or copper alloy surface. Therefore, as the metal member, it is preferable to use a copper foil, a copper-plated film, a copper material, or the like.

The surface of the metal member may be smooth or may be roughened. When a coating film is formed using the coating film-forming composition of the present invention on a roughened surface of a metal member, the adhesion to a resin can be further improved.

The formation of a coating film on a surface of a metal member is performed under the following conditions, for example.

First, a surface of the metal member is washed with an acid or the like. Next, the metal surface is immersed in the above coating film-forming composition and subjected to an immersion treatment for about 2 second to 5 minutes. The temperature of the solution at this time is preferably about 10 to 50° C., and more preferably about 15 to 35° C. In the immersion treatment, shaking may be performed as necessary. Subsequently, the solution attaching to the metal surface is removed by drying, rinsing, etc. whereby a surface-treated metal member 10 having a coating film 12 on a surface of the metal member 11 is obtained.

As described above, in the case of a conventional coating film-forming composition, it is necessary that after the immersion treatment of a metal member, drying is performed under the condition where the solution is attaching to the surface of a metal member, and the solution is concentrated/dried to form a coating film. In contrast, in the case of the coating film-forming composition of the present invention, even during immersion in the solution (when not in contact with air), coating film is formed on a metal surface. Accordingly, even in the case where the solution attaching to the metal surface is removed by rinsing after immersion in the solution without performing air-drying or the like under the condition where the solution is attaching to the metal surface, a coating film having excellent adhesion to a resin can be uniformly formed on the metal surface. In the case where drying in air is performed with the solution attaching to the metal surface, a coating film having excellent adhesion to a resin can be formed on the metal surface even by a short-time drying treatment. Accordingly, the time period required for coating film formation on a metal surface can be reduced, and also the process of coating film formation can be simplified.

For rinsing the coating film-forming composition in the form of a solution attaching to the metal surface, water or an aqueous solution may be used. In particular, in the case where rising is performed with a weak acid or alkali aqueous solution, the non-uniformity of the coating film tends to decrease, resulting in improved adhesion to a resin. As a weak acid, for example, sulfuric acid or hydrochloric acid at about 0.1 to 2 wt % is preferable, and as an alkali, an aqueous NaOH solution or an aqueous KOH solution at about 0.1 to 5 wt % is preferable.

By using the coating film-forming composition of the present invention, even when the time from when the coating film-forming composition is brought into contact with a surface of a metal member by immersion, spraying, or the like to when the solution attaching to the surface of the metal member is removed (in the case of immersion, the time from the removal of a metal member from the solution to rinsing; in the case of spraying, the time from the completion of spraying to rinsing) is 2 minutes or less, a coating film having excellent adhesion to a resin can be formed on the metal surface. In terms of improving the production efficiency, the time from when the coating film-forming composition is brought into contact with a surface of a metal member to when the solution attaching to the surface of the metal member is removed (rinsing) is more preferably 1.5 minutes or less, and still more preferably 1 minute or less.

As described above, the coating film-forming composition of the present invention is excellent in terms of forming a coating film in a solution and also has high absorptivity on a metal surface. Therefore, a coating film can be formed on a metal surface even only by an immersion treatment, and even when the solution is removed by rinsing the metal surface without drying after immersion, coating film formation state on the metal surface is maintained. In addition, in the case where the coating film-forming composition is applied to a composite member of a metal and another material, a coating film can be selectively formed on a surface of the metal.

Although the coating film 12 is formed only on one side of the plate-shaped metal member 11 in FIG. 1, the coating film may also be formed on both sides of a metal member. It is preferable that the coating film is formed over the entire surface joined to a resin. The method for forming a coating film on a surface of a metal member is not limited to the immersion method, and it is possible to select a suitable application method such as spraying or bar coating.

At the time of coating film formation, it is preferable that the metal surface is not etched. Specifically, the etching amount of the metal surface at the time of coating film formation is preferably 0.5 μm or less, more preferably 0.3 μm or less, and still more preferably 0.2 μm or less. When the coating film-forming composition has pH of 4 or more and is substantially free of oxidizing agent as described above, the etching of the metal surface due to the contact with the solution can be suppressed.

[Metal-Resin Composite]

Figure 2:
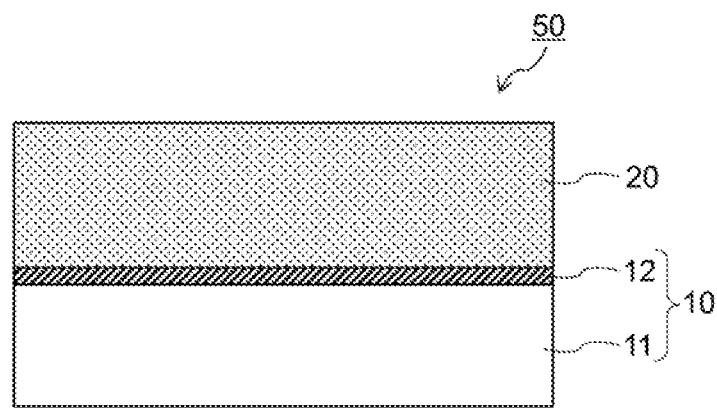
FIG. 2 is a schematic cross-sectional view showing one embodiment of a metal-resin composite.

Onto the coating film 12-formed surface of the surface-treated metal member 10, a resin member 20 is joined, whereby a metal-resin composite 50 shown in FIG. 2 is obtained. Although the resin member (resin layer) 20 is stacked only on one side of the plate-shaped metal member 11 with the coating film 12 therebetween in FIG. 2, the resin member may also be joined on both sides of a metal member.

As the method for joining the surface-treated metal member 10 and the resin member 20 together, it is possible to employ a method such as lamination pressing, lamination, coating, injection molding, or transfer molding. For example, by laminating a resin layer on a copper layer or copper alloy layer surface with an adhesive layer therebetween, a metal-resin laminate for use as a printed wiring board or the like is obtained.

The resin forming the above resin member is not particularly limited, and examples thereof include thermoplastic resins such as acrylonitrile/styrene copolymer resin (AS resin), acrylonitrile/butadiene/styrene copolymer resin (ABS resin), fluorine resin, polyamide, polyethylene, polyethylene terephthalate, polyvinylidene chloride, polyvinyl chloride, polycarbonate, polystyrene, polysulfone, polypropylene, and liquid crystal polymer, thermosetting resins such as epoxy resin, phenol resin, polyimide, polyurethane, bis-maleimide-triazine resin, modified polyphenylene ether, and cyanate ester, and UV-curable resins such as UV-curable epoxy resin and UV-curable acrylic resin. These resins may be modified with a functional group or may also be reinforced with, for example, glass fibers, aramid fibers, or other fiber.

The coating film formed on a metal surface using the coating film-forming composition of the present invention has excellent adhesion between the metal and a resin. Therefore, without additional layers therebetween, the resin member 20 can be directly joined onto the coating film 12 disposed on the metal member surface. In other words, when the coating film-forming composition of the present invention is used, without additional treatments, a metal-resin composite having high adhesion can be obtained by simply forming a coating film on a metal member surface, and joining a resin member directly thereonto.

Depending on the kind of resin material to be joined an adhesive layer made of a silane coupling agent or the like may be formed on the coating film 12. The coating film 12 formed on the metal surface has excellent adhesion to a resin. In addition, it also functions as an underlay for fixing an adhesive component, such as the silane coupling agent, to the metal surface. When an additional adhesive layer is disposed on the coating film formed on a metal surface using the coating film-forming composition of the present invention, the adhesion between the metal and a resin may be further improved.

EXAMPLES

Hereinafter, examples of the present invention will be described together with comparative examples. Incidentally, the present invention is not limited to the following examples.

[Preparation of Test Copper Foil]

A copper clad laminate (3EC-III manufactured by Mitsui Mining & Smelting Co., Ltd., copper foil thickness: 35 μm) cut to 100 mm×100 mm was immersed and shaken in a 6.25 wt % sulfuric acid solution at normal temperature for 20 seconds to perform a derusting treatment, then rinsed with water, and dried to give a test copper foil (test piece).

[Preparation of Solution]

Each component was dissolved in ion exchange water to adjust blending quantity (concentrations) shown in Table 1, and then 1.0 N hydrochloric acid or a 1.0 N aqueous sodium hydroxide solution was added to make the pH shown in Table 1, thereby preparing a solution.

The silane coupling agent A is an imidazole-based silane coupling agent represented by the following formula, and a commercially available product (JX Metal IS1000) was used. In the following formula, $R^1$ to $R^4$ are each an alkyl group, and n is an integer of 1 to 3.

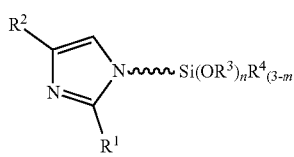

The silane coupling agent B is N,N'-bis(2-aminoethyl)-6-(3-triethoxysilylpropyl)amino-1,3,5-triazine-2,4-diamine represented by the following formula, and was synthesized in accordance with Example 1 of WO 2013/186941.

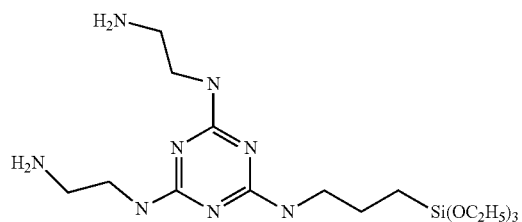

The silane coupling agent C is N-phenyl-3-aminopropyltrimethoxysilane represented by the following formula, and a commercially available product (Shin-Etsu Silicone KBM-573) was used.

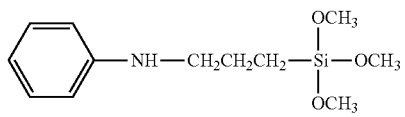

The silane coupling agent D is N-(2-aminoethyl)-3-aminopropyltrimethoxysilane represented by the following formula, and a commercially available product (Shin-Etsu Silicone KBM-603) was used.

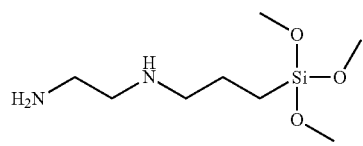

The triazine derivative E is 2,4-Diamino-6-[2-(2-methyl-1-imidazolyl)ethyl]-1,3,5-triazine, and a commercially available product was used.

The "melamine-based compound" is a compound represented by the following formula, and was synthesized in the following synthesis example.

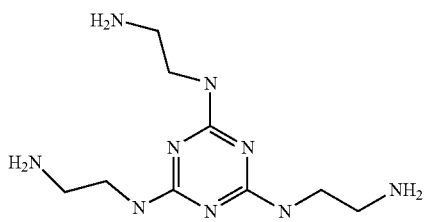 [SMILES: NCCNc1nc(NCCN)nc(NCCN)n1]

<Synthesis Example of Melamine-Based Compound>

To a THF solution of anhydrous ethylenediamine (1.5 mol) maintained at 50 to 55° C., a THF solution of cyanuric chloride (0.1 mol) was added dropwise. Subsequently, the mixture was allowed to react for 3 hours at 50 to 55° C. and then cooled to 20° C. An aqueous sodium hydroxide solution and isopropyl alcohol were added to the reaction solution, and the solvent was distilled off. Subsequently, dehydrated ethanol was added, and the precipitated sodium chloride was separated by filtration. The ethanol and ethylenediamine were distilled off from the filtrate, thereby giving a syrup-like reaction product.

[Evaluation]

<Coating Film Formability>

In Levels 1 to 3, a test piece was immersed in the solution (25° C.) of Table 1 within 24 hours after preparation for 15 seconds (Level 1), 30 seconds (Level 2), or 60 seconds (Level 3), then taken out from the solution and immediately rinsed with water, and subsequently dried. With respect to the sample of each level, changes in color tone were visually checked, and also the presence of an organic constituent-derived peak was checked with the infrared absorption (reflection absorption) spectrum. When a change in color tone was seen on the copper foil surface, and also an organic component-derived peak was confirmed, such a sample was rated as having a coating film formed thereon.

Based on the above evaluation results, the film formability of the solution was ranked into the following four classes.

A: Coating film was formed in Level 1 (immersion time: 15 seconds).

B: Coating film was formed in Levels 2 (immersion time: 30 seconds), but not formed in Level 1.

C: Coating film was formed in Levels 3 (immersion time: 60 seconds), i.e., coating film was formed within 60 seconds, but not formed in Levels 1 and 2.

D: No coating film was formed in all Levels 1 to 3.

<Hydrochloric Acid Durability>

A dry film resist having a thickness of 20 μm was allowed to adhere onto a test piece that has been subjected to a coating film formation treatment at the above Level 3 (immersion time: 60 seconds), and then heated at 100° C. for 15 minutes to thermally cure the resist, thereby preparing a test piece. In the surface of the resist on the test piece, cuts were formed in a grid pattern at intervals of 2 mm to form 100 grids, followed by immersion in 6N hydrochloric acid for 10 minutes. After rinsing with water and drying, a pressure-sensitive adhesive tape was attached to the resist surface and then peeled off, and the number of grids remaining on the test piece was counted.

Table 1 shows the compositions of the solutions and evaluation results of Examples and Comparative Examples.

TABLE 1

| | Composition | | | | Adhesion |
|---|---|---|---|---|---|
| | Component name | Amount (wt %) | pH | Film formability | (hydrochloric acid resistance) |
| Example 1 | Aminotriazole | 0.2 | 4.0 | A | 65 |
| | Sodium thiosulfate | 0.5 | | | |
| Example 2 | Guanine | 0.5 | 6.0 | B | 72 |
| | Ammonium thiocyanate | 0.5 | | | |
| Example 3 | 2,4,5,6-Tetraaminopyrimidine sulfate | 0.1 | 7.0 | C | 67 |
| | Diammonium dithiodiglycolate | 0.2 | | | |
| Example 4 | Triazine derivative E | 0.05 | 10.0 | C | 61 |
| | Sodium diethyldithiocarbamate | 0.1 | | | |
| Example 5 | Silane coupling agent A | 0.2 | 9.0 | A | 91 |
| | Sodium thiosulfate | 0.05 | | | |
| Example 6 | Silane coupling agent B | 0.3 | 8.0 | A | 95 |
| | Ammonium thiocyanate | 0.3 | | | |
| Example 7 | Silane coupling agent C | 1 | 7.0 | C | 85 |
| | Diammonium dithiodiglycolate | 0.1 | | | |
| Example 8 | Triazine derivative E | 0.05 | 8.0 | B | 89 |
| | Silane coupling agent D | 0.1 | | | |
| | Ammonium thiocyanate | 0.4 | | | |
| Example 9 | Silane coupling agent B | 0.01 | 9.0 | B | 63 |
| | Sodium thiosulfate | 0.001 | | | |
| Example 10 | Melamine-based compound | 0.4 | 7.0 | A | 83 |
| | Sodium thiosulfate | 0.3 | | | |
| Example 11 | Melamine-based compound | 0.4 | 7.0 | B | 90 |
| | Ammonium thiocyanate | 0.3 | | | |
| Example 12 | Melamine-based compound | 0.4 | 7.0 | C | 71 |
| | Diammonium dithiodiglycolate | 0.3 | | | |
| Example 13 | Melamine-based compound | 0.4 | 7.0 | C | 78 |
| | Sodium diethyldithiocarbamate | 0.3 | | | |
| Comparative Example 1 | Sodium thiosulfate | 0.2 | 6.0 | D | 3 |
| Comparative Example 2 | Melamine-based compound | 0.4 | 7.0 | D | 7 |
| Comparative Example 3 | Silane coupling agent D | 0.5 | 8.0 | C | 5 |
| | Ammonium thiocyanate | 0.2 | | | |
| Comparative Example 4 | Melamine-based compound | 0.4 | 7.0 | D | 3 |
| | Sodium sulfate | 0.3 | | | |

As shown in Table 1, in all of Examples 1 to 13, a coating film was formed on the metal surface as a result of immersion within 60 seconds, and also the adhesion of the resist was excellent even after immersing the test piece in hydrochloric acid.

In Comparative Example 1 where an aromatic-containing compound was not contained, and only sodium thiosulfate was used, and also in Comparative Example 2 where a thio compound was not contained, and only an aromatic-containing compound was used, no coating film was formed as a result of immersion for 60 seconds. Also in Comparative Example 4 where an aromatic-containing compound and a sulfate were used, no coating film was formed as a result of immersion for 60 seconds.

In Comparative Example 3 where ammonium thiocyanate and a silane coupling agent D containing no aromatic were used, a coating film was formed as a result of immersion for 60 seconds. However, as compared with Examples 2, 6, 8, and 11 where ammonium thiocyanate was used as a thio compound, the time required for coating film formation was longer. In addition, in the coating film of Comparative Example 3, the adhesion of the resist was low after immersion in hydrochloric acid, and the hydrochloric acid durability was insufficient. From these results, it is likely that in Example 8 where a silane coupling agent D was used as in Comparative Example 3, a triazine derivative (2,4-diamino-6-[2-(2-methyl-1-imidazolyl)ethyl]-1,3,5-triazine), which is an aromatic compound, contributes to the promotion of coating film formation and the improvement in adhesion to a resin (hydrochloric acid durability).

As a result of comparison of Examples 10 to 13 where a melamine-based compound obtained in the Synthesis Examples was used as an aromatic compound, it can be seen that in Example 10 where sodium thiosulfate was used as a thio compound and Example 11 where ammonium thiocyanate was used, a coating film can be formed within a shorter period of time, and also the adhesion is excellent. In addition, it can be seen that also among Examples 1 to 9, in Examples 1, 2, 5, 6, 8, and 9 where sodium thiosulfate or ammonium thiocyanate was used as a thio compound, a coating film can be formed within a shorter period of time. In particular, in Example 5 where an imidazole-based silane coupling agent A was used and Example 6 where a triazine-based silane coupling agent B was used, it was possible to achieve both the coating film formability in a short period of time and the high adhesion (hydrochloric acid durability), and they had excellent performance.

The invention claimed is:
1. A coating film-forming composition that is capable of forming a coating film on a metal surface for improving adhesion to a resin,
the composition comprising:
an aromatic compound having an amino group and an aromatic ring in one molecule; and
a thio compound,
wherein the thio compound is selected from the group consisting of salts of sulfur oxoacids having a pKa of more than −1.9, thioacids and salts thereof, and sulfur-containing carboxylic acids and salts thereof.

2. The coating film-forming composition according to claim 1, wherein a pH of the coating film-forming composition is 4 to 10.

3. The coating film-forming composition according to claim 1, wherein the aromatic ring of the aromatic compound is a nitrogen-containing aromatic ring.

4. The coating film-forming composition according to claim 1, wherein the aromatic compound has a primary amino group or a secondary amino group.

5. The coating film-forming composition according to claim 1, wherein the aromatic compound has a silanol group or an alkoxysilyl group.

6. The coating film-forming composition according to claim 1, wherein the thio compound is ionized to form anion in an aqueous solution.

7. The coating film-forming composition according to claim 1, wherein the thio compound is thiosulfate or thiocyanate.

8. A method for producing a surface-treated metal member, comprising bringing the coating film-forming composition according to claim 1 into contact with a surface of a metal member, thereby forming a coating film on the surface of the metal member.

9. The method for producing a surface-treated metal member according to claim 8, further comprising, after bringing the coating film-forming composition into contact with the surface of the metal member, rinsing the surface of the metal member within 2 minutes.

10. The method for producing a surface-treated metal member according to claim 8, wherein the metal member is copper or a copper alloy.

11. A method for producing a metal-resin composite, comprising forming a coating film on a surface of a metal member by the method according to claim 8, and then joining a resin member onto the coating film.

* * * * *